US012575347B2

(12) United States Patent
Ichimura et al.

(10) Patent No.: US 12,575,347 B2
(45) Date of Patent: Mar. 10, 2026

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Keita Ichimura, Toyama (JP); Masanori Nakayama, Toyama (JP); Hiroto Igawa, Toyama (JP); Yuichiro Takeshima, Toyama (JP); Katsunori Funaki, Toyama (JP); Hiroki Kishimoto, Toyama (JP); Yuki Yamakado, Toyama (JP); Yasutoshi Tsubota, Toyama (JP); Tatsushi Ueda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 1188 days.

(21) Appl. No.: 17/473,677

(22) Filed: Sep. 13, 2021

(65) Prior Publication Data

US 2022/0084816 A1 Mar. 17, 2022

(30) Foreign Application Priority Data

Sep. 14, 2020 (JP) ................................. 2020-153951

(51) Int. Cl.
*H01L 21/02* (2006.01)
*C23C 16/455* (2006.01)
*H01J 37/32* (2006.01)
(52) U.S. Cl.
CPC .. *H01L 21/02129* (2013.01); *C23C 16/45557* (2013.01); *H01J 37/32449* (2013.01); *H01J 37/32834* (2013.01); *H01J 2237/327* (2013.01)

(58) Field of Classification Search
CPC ............... H05H 1/46; B01J 2219/0894; H01L 29/66757; H01L 21/02532;
(Continued)

(56) References Cited

U.S. PATENT DOCUMENTS

2005/0287776 A1* 12/2005 Sasaki ................. H01L 21/2236
438/510
2006/0166446 A1 7/2006 Sasaki et al.
(Continued)

FOREIGN PATENT DOCUMENTS

JP 1012890 A 1/1998
JP 2004179592 A 6/2004
(Continued)

OTHER PUBLICATIONS

Office Action in corresponding Japanese Patent Application No. 2020-153951, drafted Apr. 13, 2022, with English translation.
(Continued)

*Primary Examiner* — Anthony J Zimmer
*Assistant Examiner* — Syed T Iqbal
(74) *Attorney, Agent, or Firm* — Edell, Shapiro & Finnan, LLC

(57) ABSTRACT

According to one aspect of the technique, there is provided a method of manufacturing a semiconductor device, including: modifying a surface of a substrate into an impurity-containing layer by performing: (a) supplying an impurity-containing gas containing an impurity and a dilution gas into a process chamber in which the substrate is accommodated; (b) plasma-exciting the impurity-containing gas and the dilution gas; and (c) supplying an active species containing the impurity generated by plasma-exciting the impurity-containing gas and the dilution gas to the substrate, wherein a flow rate ratio of the impurity-containing gas to the dilution gas is controlled in (a) such that a partial pressure
(Continued)

of the impurity-containing gas in the process chamber is set to a predetermined partial pressure less than a partial pressure at which the impurity-containing gas forms deposits containing a polymer in the process chamber.

13 Claims, 7 Drawing Sheets

(58) Field of Classification Search
CPC .......... H01L 29/66765; H01L 27/1214; H01L 2924/00; H01L 2924/0002; H01L 29/04; H01L 29/78696; H01L 27/12; H01L 21/0262; H01L 29/78675; H01L 21/02274; H01L 21/3105; H01L 29/78678; H01L 21/02422; H01L 21/02488; H01L 21/2236; H01L 21/0217; H01L 21/02211; H01L 21/0237; H01L 21/0242; H01L 21/0245; H01L 21/02521; H01L 21/02576; H01L 21/02579; H01L 21/02661; H01L 21/268; H01L 21/28079; H01L 21/76843; H01L 21/76877; H01L 27/1285; H01L 29/4908; H01L 29/78618; H01L 29/78621; H01L 29/78669; H01L 21/02164; H01L 21/02675; H01L 21/32137; H01L 29/66795; H01L 31/03685; H01L 21/0228; H01L 21/0234; H01L 21/02502; H01L 21/02595; H01L 21/02672; H01L 21/02691; H01L 21/0332; H01L 21/0337; H01L 21/28185; H01L 21/28194; H01L 21/3081; H01L 21/3086; H01L 21/3146; H01L 21/3221; H01L 21/67155; H01L 21/76864; H01L 21/76873; H01L 21/823857; H01L 27/1277; H01L 27/1288; H01L 29/40114; H01L 29/513; H01L 29/518; H01L 29/78633; H01L 29/78645; H01L 29/78663; H01L 29/78681; H01L 29/78684; H01L 31/02327; H01L 31/03762; H01L 31/0475; H01L 31/102; H01L 31/1816; H01L 31/20; H01L 21/02115; H01L 21/02126; H01L 21/02271; H01L 21/02321; H01L 21/02683; H01L 21/02686; H01L 21/32139; H01L 21/67207; H01L 27/1296; H01L 29/66969; H01L 31/03529; H01L 31/076; H01L 21/02178; H01L 21/022; H01L 21/02208; H01L 21/02266; H01L 21/02323; H01L 21/02494; H01L 21/02505; H01L 21/02529; H01L 21/02554; H01L 21/02565; H01L 21/02631; H01L 21/02645; H01L 21/02678; H01L 21/0276; H01L 21/3065; H01L 21/311; H01L 21/31111; H01L 21/31144; H01L 21/68742; H01L 21/76831; H01L 21/76834; H01L 21/76844; H01L 21/76886; H01L 23/5226; H01L 23/53238; H01L 23/53295; H01L 29/6675; H01L 29/786; H01L 29/78606; H01L 29/78609; H01L 29/78672; H01L 29/78687; H01L 29/78693; H01L 31/03682; H01L 31/05; H01L 31/0508; H01L 31/077; H01L 31/1872; H01L 31/1876; H01L 21/02118; H01L 21/0212; H01L 21/02129; H01L 21/0214; H01L 21/02203; H01L 21/02238; H01L 21/02252; H01L 21/02315; H01L 21/02356; H01L 21/265; H01L 21/26513; H01L 21/28123; H01L 21/31116; H01L 21/31138; H01L 21/3127; H01L 21/314; H01L 21/3185; H01L 21/32135; H01L 21/32136; H01L 21/465; H01L 21/67115; H01L 21/68792; H01L 21/8234; H01L 22/12; H01L 22/20; H01L 22/26; H01L 27/06; H01L 27/088; H01L 27/1225; H01L 29/24; H01L 29/665; H01L 29/66545; H01L 29/6659; H01L 29/78648; H01L 29/7869; H01L 31/02008; H01L 31/046; H01L 31/0463; H01L 31/048; H01L 31/0725; H01L 31/0747; H01L 31/1804; H01L 31/202; H01L 31/204

See application file for complete search history.

(56) References Cited

U.S. PATENT DOCUMENTS

| | | | |
|---|---|---|---|
| 2006/0264051 A1 | 11/2006 | Thibaut | |
| 2009/0042321 A1 | 2/2009 | Sasaki et al. | |
| 2010/0022076 A1 | 1/2010 | Godet et al. | |
| 2011/0079241 A1 | 4/2011 | Sinha et al. | |
| 2014/0179028 A1 | 6/2014 | Ueda et al. | |
| 2015/0132929 A1 | 5/2015 | Horigome et al. | |
| 2017/0062192 A1* | 3/2017 | Oota | H01L 29/78696 |
| 2017/0287786 A1 | 10/2017 | Ogawa | |
| 2018/0174838 A1 | 6/2018 | Ueda et al. | |
| 2018/0182790 A1 | 6/2018 | Yamaguchi | |

FOREIGN PATENT DOCUMENTS

| | | | |
|---|---|---|---|
| JP | 2011529275 A | 12/2011 | |
| JP | 2013-506962 A | 2/2013 | |
| JP | 2017-183487 A | 10/2017 | |
| JP | 2018-110140 A | 7/2018 | |
| TW | 200415668 A | 8/2004 | |
| TW | 200849344 A | 12/2008 | |
| TW | 201445639 A | 12/2014 | |
| WO | 2005020306 A1 | 3/2005 | |

OTHER PUBLICATIONS

Taiwan Office Action with English translation in Taiwan Application No. 110130113, issued Sep. 7, 2022, 19 pages.
IPOS Office Action in Singapore Application No. 10202110034S, issued Nov. 23, 2022, 8 pages.
First Office Action with English translation in Chinese Application No. 202111069117.1, issued Oct. 18, 2024, 22 pages.

* cited by examiner

FIG. 4

| SAMPLE | RF POWER [W] | PARTIAL PRESSURE OF $B_2H_6$ GAS [Pa] | TIME [Sec.] | FLOW RATE OF 2% $B_2H_6$ GAS [sccm] | FLOW RATE OF $H_2$ GAS [sccm] | WATER REPELLENCY | DOSE AMOUNT [Atoms /cm$^3$] | STEP COVERAGE [%] |
|---|---|---|---|---|---|---|---|---|
| #1 | 3500 | 0.002 | 30 | 2 | 1998 | YES | 1.7E14 | 26 |
| #2 | 2000 | | | | | YES | 5.4E13 | 73 |
| #3 | 500 | | | | | YES | 3.7E13 | 81 |
| #4 | 3500 | | 60 | | | YES | 1.2E15 | 53 |
| #5 | | 0.01 | 30 | 10 | 1990 | YES | 5.7E13 | 49 |
| #6 | | 0.05 | | 50 | 1950 | NO | 6.1E14 | 87 |
| #7 | | 0.1 | | 100 | 1900 | NO | 2.1E15 | 63 |

WITH DEPOSITS

WITHOUT DEPOSITS

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2020-153951 filed on Sep. 14, 2020, the entire contents of which are hereby incorporated by reference.

TECHNICAL FIELD

The present disclosure relates to a method of manufacturing a semiconductor device, a substrate processing apparatus and a non-transitory computer-readable recording medium.

BACKGROUND

As a part of manufacturing processes of a semiconductor device, a process of modifying a film formed on a surface of a substrate by a plasma may be performed.

As a part of the manufacturing processes of the semiconductor device described above, for example, a substrate processing such as a doping process of injecting (doping) boron (B) serving as an impurity (dopant) into the surface of the substrate using a boron-containing gas may be performed. However, deposits may be generated when boron is injected. As a result, the deposits may attach to the surface of the substrate.

SUMMARY

Described herein is a technique capable of suppressing a generation of deposits when performing a doping process to a substrate using a plasma.

According to one aspect of the technique of the present disclosure, there is provided a method of manufacturing a semiconductor device, including: modifying a surface of a substrate into an impurity-containing layer by performing: (a) supplying an impurity-containing gas containing an impurity and a dilution gas into a process chamber in which the substrate is accommodated; (b) plasma-exciting the impurity-containing gas and the dilution gas; and (c) supplying an active species containing the impurity generated by plasma-exciting the impurity-containing gas and the dilution gas to the substrate, wherein a flow rate ratio of the impurity-containing gas to the dilution gas is controlled in (a) such that a partial pressure of the impurity-containing gas in the process chamber is set to a predetermined partial pressure less than a partial pressure at which the impurity-containing gas forms deposits containing a polymer in the process chamber.

BRIEF DESCRIPTION OF THE DRAWINGS

FIG. 4 is a diagram schematically illustrating measurement results of a water repellency, a dose amount and a step coverage of each boron-containing layer formed under different conditions.

DETAILED DESCRIPTION

Embodiments

Figure 1:
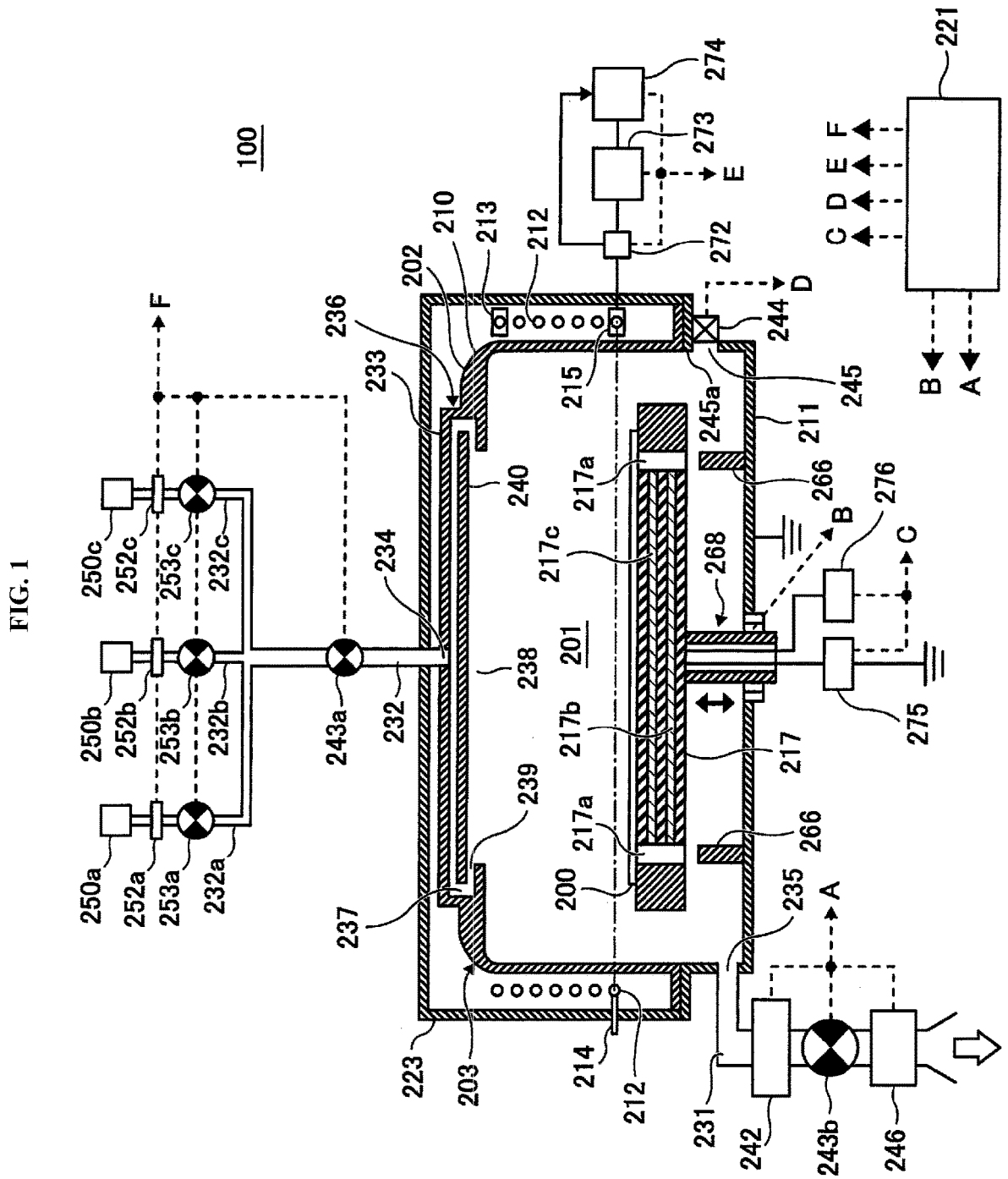
FIG. 1 is a diagram schematically illustrating a vertical cross-section of a process furnace 202 of a substrate processing apparatus 100 preferably used in one or more embodiments described herein.

Hereinafter, one or more embodiments (also simply referred to as "embodiments") according to the technique of the present disclosure will be described with reference to FIGS. 1 through 3. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Substrate Processing Apparatus

As shown in FIG. 1, a substrate processing apparatus 100 includes a process furnace 202 in which a wafer 200 serving as a substrate is accommodated and the wafer 200 is processed by a plasma. The process furnace 202 includes a process vessel 203. A process chamber 201 is defined by the process vessel 203. The process vessel 203 includes a dome-shaped upper vessel 210 and a bowl-shaped lower vessel 211. By covering the lower vessel 211 with the upper vessel 210, the process chamber 201 is defined.

A gate valve 244 is provided on a lower side wall of the lower vessel 211. The gate valve 244 is configured to open or close a substrate loading/unloading port 245. While the gate valve 244 is open, the wafer 200 can be transferred (loaded) into the process chamber 201 through the substrate loading/unloading port 245 or can be transferred (unloaded) out of the process chamber 201 through the substrate loading/unloading port 245. While the gate valve 244 is closed, the gate valve 244 maintains the process chamber 201 airtight.

Figure 2:
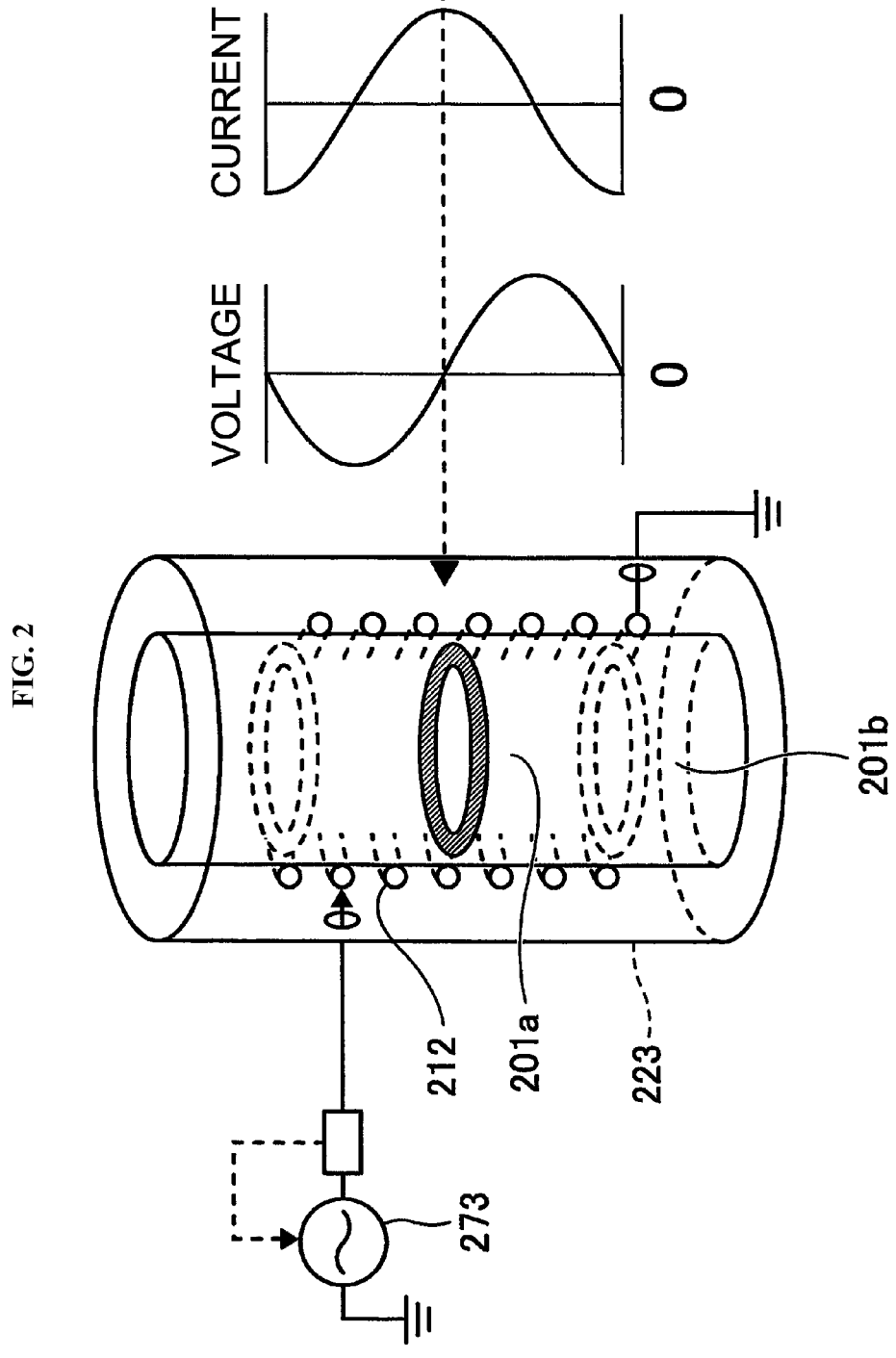
FIG. 2 is a diagram schematically illustrating a principle of generating a plasma in the substrate processing apparatus 100 according to the embodiments described herein.

As shown in FIG. 2, the process chamber 201 includes a plasma generation space 201a and a substrate processing space 201b that communicates with the plasma generation space 201a and in which the wafer 200 is processed. A resonance coil 212 described later is provided around the plasma generation space 201a and around an outer periphery of the process vessel 203. The plasma generation space 201a refers to a space in which the plasma is generated, for example, a space above a lower end (indicated by a dot-and-dash line in FIG. 1) of the resonance coil 212 in the process chamber 201. The substrate processing space 201b refers to a space in which the wafer 200 is processed by the plasma, for example, a space below the lower end of the resonance coil 212 in the process chamber 201.

A susceptor 217 serving as a substrate support is provided at a center of a bottom portion of the process chamber 201. A substrate placing surface on which the wafer 200 is placed is provided on an upper surface of the susceptor 217. A heater 217b serving as a heating apparatus (heating structure) is integrally embedded in the susceptor 217. When electric power is supplied to the heater 217b through a heater power regulator 276, the heater 217b is configured to heat the wafer 200 placed on the substrate placing surface such that the wafer 200 is heated to a predetermined temperature ranging, for example, from 25° C. to 1,000° C.

The susceptor 217 is electrically insulated from the lower vessel 211. An impedance adjustment electrode 217c is provided in the susceptor 217. The impedance adjustment electrode 217c is grounded via a variable impedance regulator 275 serving as an impedance adjusting structure. By changing an impedance of the variable impedance regulator 275 within a predetermined range, it is possible to control a potential (bias voltage) of the wafer 200 via the impedance adjustment electrode 217c and the susceptor 217 when performing a plasma process.

A susceptor elevator 268 configured to elevate and lower the susceptor 217 is provided below the susceptor 217. Through-holes (for example, three through-holes) 217a are provided at the susceptor 217, and support pins (for example, three support pins) 266 serving as a support capable of supporting the wafer 200 are provided at a bottom of the lower vessel 211 corresponding to the three through-holes 217a. When the susceptor 217 is lowered by the susceptor elevator 268, tips (front ends) of the three support pins 266 pass through the three through-holes 217a, respectively, and protrude from the substrate placing surface of the susceptor 217. Thereby, the three support pins 266 are capable of supporting the wafer 200 from thereunder.

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. The gas supply head 236 is configured to supply a gas such as a boron-containing gas, a hydrogen-containing gas and an oxygen-containing gas into the process chamber 201. The buffer chamber 237 functions as a dispersion space in which the gas introduced (supplied) through the gas inlet port 234 is dispersed.

A downstream end of a gas supply pipe 232a through which a gas containing boron (B) serving as an impurity (also referred to as the boron-containing gas) such as diborane (B$_2$H$_6$) gas is supplied, a downstream end of a gas supply pipe 232b through which the hydrogen-containing gas such as hydrogen (H$_2$) gas is supplied and a downstream end of a gas supply pipe 232c through which the oxygen-containing gas such as oxygen (02) gas is supplied are connected to join the gas inlet port 234 provided at a gas supply pipe 232. A boron-containing gas supply source 250a, a mass flow controller (MFC) 252a serving as a flow rate controller and a valve 253a serving as an opening/closing valve are sequentially provided at the gas supply pipe 232a in order from an upstream side to a downstream side of the gas supply pipe 232a along a gas flow direction. A hydrogen-containing gas supply source 250b, an MFC 252b and a valve 253b are sequentially provided at the gas supply pipe 232b in order from an upstream side to a downstream side of the gas supply pipe 232b along the gas flow direction. An oxygen-containing gas supply source 250c, an MFC 252c and a valve 253c are sequentially provided at the gas supply pipe 232c in order from an upstream side to a downstream side of the gas supply pipe 232c along the gas flow direction. A valve 243a is provided on a downstream side of a location where the gas supply pipe 232a, the gas supply pipe 232b and the gas supply pipe 232c join. It is possible to supply various gases such as the boron-containing gas, the hydrogen-containing gas and the oxygen-containing gas into the process vessel 203 via the gas supply pipes 232a, 232b and 232c by opening and closing the valves 253a, 253b, 253c and 243a while adjusting flow rates of the respective gases by the MFCs 252a, 252b and 252c. In addition to the various gases described above, the gas supply pipes 232a, 232b and 232c are configured to be capable of supplying nitrogen (N$_2$) gas serving as an inert gas.

The boron-containing gas is used as an impurity-containing gas, and the hydrogen-containing gas is used as a dilution gas. A mixed gas containing the boron-containing gas and the hydrogen-containing gas is converted into a plasma state in a substrate processing described later, and is supplied to the wafer 200 on which a silicon (Si) film serving as a silicon-containing film is formed. Thereby, the silicon film formed on a surface of the wafer 200 is doped with boron serving as the impurity. As a result, the silicon film is modified into a boron-containing layer (or a boron-containing film) containing boron. The oxygen-containing gas is converted into a plasma state in the substrate processing described later, and is supplied to the wafer 200. Thereby, the boron-containing layer formed on the surface of the wafer 200 is modified (oxidized). The oxygen-containing gas acts as an oxidizing agent (or an oxidizing gas) in the substrate processing described later. The N$_2$ gas is used in the substrate processing described later without being converted into a plasma state, and may act as a purge gas.

A first supplier (which is a first supply system) is constituted mainly by the gas supply head 236 (that is, the lid 233, the gas inlet port 234, the buffer chamber 237, the opening 238, the shield plate 240 and the gas outlet port 239), the gas supply pipe 232a, the WC 252a and the valves 253a and 243a. The first supplier may also be referred to as a boron-containing gas supplier (which is a boron-containing gas supply system) or an impurity-containing gas supplier (which is an impurity-containing gas supply system). A second supplier (which is a second supply system) is constituted mainly by the gas supply head 236, the gas supply pipe 232b, the MFC 252b and the valves 253b and 243a. The second supplier may also be referred to as a hydrogen-containing gas supplier (which is a hydrogen-containing gas supply system) or a dilution gas supplier (which is a dilution gas supply system). A third supplier (which is a third supply system) is constituted mainly by the gas supply head 236, the gas supply pipe 232*c*, the WC 252*c* and the valves 253*c* and 243*a*. The third supplier may also be referred to as an oxygen-containing gas supplier (which is an oxygen-containing gas supply system) or an oxidizing agent supplier (which is an oxidizing agent supply system). The second supplier may be included in the first supplier. That is, the impurity-containing gas supplier may further include the second supplier.

An exhaust port 235 is provided on a side wall of the lower vessel 211. An inner atmosphere of the process chamber 201 is exhausted through the exhaust port 235. An upstream end of an exhaust pipe 231 is connected to the exhaust port 235. An APC (Automatic Pressure Controller) valve 242 serving as a pressure regulator (pressure adjusting structure), a valve 243*b* and a vacuum pump 246 serving as a vacuum exhaust apparatus are sequentially provided in order from an upstream side to a downstream side of the exhaust pipe 231. An exhauster (which is an exhaust system) is constituted mainly by the exhaust port 235, the exhaust pipe 231, the APC valve 242 and the valve 243*b*. The exhauster may further include the vacuum pump 246.

The resonance coil 212 of a helical shape is provided so as to surround the process vessel 203 around an outer periphery of the process chamber 201, that is, around an outer portion of a side wall of the upper vessel 210. An RF (Radio Frequency) sensor 272, a high frequency power supply 273 and a frequency matcher (also referred to as a "matcher" or a "frequency controller") 274 are connected to the resonance coil 212. A shield plate 223 is provided around an outer periphery of the resonance coil 212.

The high frequency power supply 273 is configured to supply a high frequency power (RF power) to the resonance coil 212. The RF sensor 272 is provided at an output side of the high frequency power supply 273. The RF sensor 272 is configured to monitor information of the traveling wave or reflected wave of the supplied high frequency power. The frequency matcher 274 is configured to adjust a frequency of the high frequency power output from the high frequency power supply 273 so as to minimize the reflected wave based on the information of the reflected wave monitored by the RF sensor 272.

Both ends (that is, a first end and a second end) of the resonance coil 212 are electrically grounded. The first end of the resonance coil 212 is grounded via a movable tap 213. The second end of the resonance coil 212 is grounded via a fixed ground 214. A movable tap 215 capable of appropriately setting a position of receiving the high frequency power from the high frequency power supply 273 is provided between the first end and the second end of the resonance coil 212.

The shield plate 223 is provided to shield the leakage of the electromagnetic wave to an outside of the resonance coil 212 and to form a capacitive component of the resonance coil 212 for constructing a resonance circuit.

A plasma generator (which is a plasma generating structure) is constituted mainly by the resonance coil 212, the RF sensor 272 and the frequency matcher 274. The plasma generator may further include the high frequency power supply 273 or the shield plate 223.

Hereinafter, an operation of the plasma generator and the properties of the generated plasma will be supplementarily described with reference to FIG. 2.

The resonance coil 212 is configured to function as a high frequency inductively coupled plasma (ICP) electrode. For example, a winding diameter, a winding pitch and the number of winding turns of the resonance coil 212 are set such that the resonance coil 212 resonates in a full-wave-length mode to form a standing wave of a predetermined wavelength. An electrical length of the resonance coil 212 (that is, an electrode length between the grounds described above) is adjusted to an integral multiple of a wavelength of a predetermined frequency of the high frequency power supplied from the high frequency power supply 273. For example, an effective cross-section of the resonance coil 212 is set to a value ranging from 50 mm² to 300 mm², and a diameter of the resonance coil 212 is set to a value ranging from 200 mm to 500 mm. The resonance coil 212 is wound, for example, twice to 60 times. The level of the high frequency power supplied to the resonance coil 212 is set to a value ranging from 0.5 KW to 5 KW, preferably, from 1.0 KW to 4.0 KW, and the frequency of the high frequency power is set to a value ranging from 800 kHz to 50 MHz. The magnetic field generated by the resonance coil 212 is set to a value ranging from 0.01 Gauss to 10 Gauss. According to the present embodiments, as a preferred example, the frequency of the high frequency power is set to 27.12 MHz, and the electrical length of the resonance coil 212 is set equal to the wavelength of the high frequency power (about 11 meters).

The frequency matcher 274 is configured to receive a voltage signal related to the power of the reflected wave from the RF sensor 272, and to perform a corrective control operation such as increasing or decreasing the frequency (oscillation frequency) of the high frequency power output by the high frequency power supply 273 such that power of the reflected wave is minimized. The frequency matcher 274 may include a frequency control circuit (not shown) configured to perform the corrective control operation of the oscillation frequency. The frequency control circuit oscillates at an unloaded resonance frequency of the resonance coil 212 before the plasma is turned on, and oscillates a preset frequency (that is, a frequency increased or decreased from the unloaded resonance frequency) after the plasma is turned on so that the power of the reflected wave is minimized. The frequency control circuit feeds back a control signal including the frequency obtained by performing the corrective control operation to the high frequency power supply 273. The high frequency power supply 273 corrects the frequency of the high frequency power based on the control signal. The frequency of the high frequency power is optimized to a resonance frequency at which the power of the reflected wave in the transmission line becomes zero.

With the configuration of the plasma generator described above, an induction plasma of a good quality with almost no capacitive coupling with a component such as an inner wall of the process chamber 201 and the susceptor 217 is excited in the plasma generation space 201*a*. That is, a donut-shaped plasma with extremely low electric potential when viewed from above is generated in the plasma generation space 201*a*. According to the preferred example of the present embodiments in which the electrical length of the resonance coil 212 is set equal to the wavelength of the high frequency power, the donut-shaped plasma is generated in the vicinity of a height corresponding to an electric midpoint of the resonance coil 212.

Figure 3:
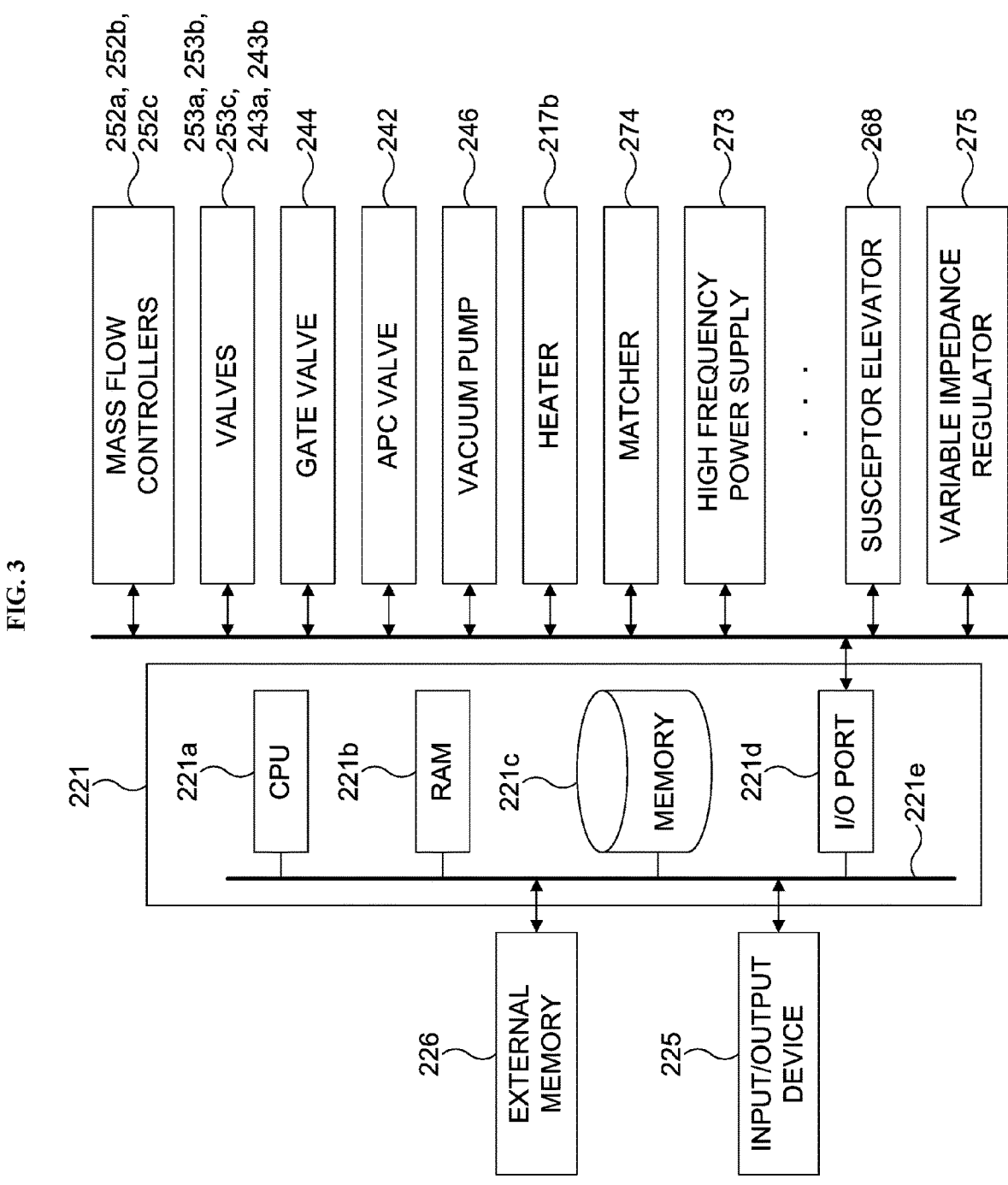
FIG. 3 is a block diagram schematically illustrating a configuration of a controller 221 and related components of the substrate processing apparatus 100 preferably used in the embodiments described herein.

As shown in FIG. 3, a controller 221 serving as a control apparatus is constituted by a computer including a CPU (Central Processing Unit) 221*a*, a RAM (Random Access Memory) 221*b*, a memory 221*c* and an I/O port 221*d*. The RAM 221*b*, the memory 221*c* and the I/O port 221*d* may exchange data with the CPU 221*a* through an internal bus 221e. For example, an input/output device 225 such as a touch panel, a mouse, a keyboard and an operation terminal (not shown) may be connected to the controller 221. A display (not shown) serving as a display structure may be connected to the controller 221.

The memory 221c may be embodied by a component such as a flash memory, an HDD (Hard Disk Drive) and a CD-ROM. For example, a control program configured to control the operation of the substrate processing apparatus 100 and a process recipe in which information such as the sequences and the conditions of the substrate processing described later is stored may be readably stored in the memory 221c. The process recipe is obtained by combining steps of the substrate processing described later such that the controller 221 can execute the steps to acquire a predetermine result, and functions as a program. The RAM 221b functions as a memory area (work area) where a program or data read by the CPU 221a is temporarily stored.

The I/O port 221d is electrically connected to the above-described components such as the MFCs 252a, 252b and 252c, the valves 253a, 253b, 253c, 243a and 243b, the gate valve 244, the APC valve 242, the vacuum pump 246, the heater 217b, the RF sensor 272, the high frequency power supply 273, the frequency matcher 274, the susceptor elevator 268 and the variable impedance regulator 275.

The CPU 221a is configured to read and execute the control program stored in the memory 221c, and to read the process recipe stored in the memory 221c in accordance with an instruction such as an operation command inputted via the input/output device 225. The CPU 221a is configured to be capable of controlling the operation of the substrate processing apparatus 100 according to the process recipe. For example, as shown in FIG. 1, the CPU 221a may be configured to perform the operation, according to the read process recipe, such as an operation of adjusting an opening degree of the APC valve 242, an opening and closing operation of the valve 243b and a start and stop of the vacuum pump 246 via the I/O port 221d and a signal line "A", an elevating and lowering operation of the susceptor elevator 268 via the I/O port 221d and a signal line "B", a power supply amount adjusting operation (temperature adjusting operation) to the heater 217b by the heater power regulator 276 based on a temperature detected by a temperature sensor (not shown) and an impedance adjusting operation by the variable impedance regulator 275 via the I/O port 221d and a signal line "C", an opening and closing operation of the gate valve 244 via the I/O port 221d and a signal line "D", a controlling operation of the RF sensor 272, the frequency matcher 274 and the high frequency power supply 273 via the I/O port 221d and a signal line "E", and gas flow rate adjusting operations of the MFCs 252a, 252b and 252c and opening and closing operations of the valves 253a, 253b, 253c and 243a via the I/O port 221d and a signal line "F".

(2) Substrate Processing

An exemplary sequence of the substrate processing of forming the boron-containing layer by doping boron serving as the impurity on the surface of the wafer 200 and forming an oxide layer serving as a cap layer on a surface of the boron-containing layer after boron is doped, which is a part of manufacturing processes of a semiconductor device, will be described. The substrate processing is performed using the substrate processing apparatus 100 described above. In the following description, the operations of the components constituting the substrate processing apparatus 100 are controlled by the controller 221.

The sequence of the substrate processing according to the present embodiments includes modifying a surface of a substrate into an impurity-containing layer by performing: (a) supplying a boron-containing gas serving as an impurity-containing gas and a hydrogen-containing gas serving as a dilution gas into the process chamber 201 in which the substrate is accommodated; (b) plasma-exciting the boron-containing gas and the hydrogen-containing gas; and (c) supplying an active species containing boron generated by plasma-exciting the boron-containing gas and the hydrogen-containing gas to the substrate, wherein a flow rate ratio of the boron-containing gas to the hydrogen-containing gas is controlled in (a) such that a partial pressure of the boron-containing gas in the process chamber 201 is set to a predetermined partial pressure less than a partial pressure at which the boron-containing gas forms deposits containing a polymer in the process chamber 201.

In the sequence of the substrate processing according to the present embodiments, a surface of the boron-containing layer is modified into an oxide layer after the boron-containing layer is formed on the surface of the substrate, by performing: (d) supplying an oxygen-containing gas into the process chamber 201 in which the substrate is accommodated; (e) plasma-exciting the oxygen-containing gas; and (f) supplying an active species containing oxygen generated by plasma-exciting the oxygen-containing gas to the surface of the substrate.

In the present specification, the term "wafer" may refer to "a wafer itself", or may refer to "a wafer and a stacked structure (aggregated structure) of a predetermined layer (or layers) or a film (or films) formed on a surface of a wafer". In the present specification, the term "a surface of a wafer" may refer to "a surface of a wafer itself", or may refer to "a surface of a predetermined layer or a film formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer or another film formed on a wafer". In the present specification, the terms "substrate" and "wafer" may be used as substantially the same meaning. That is, the term "substrate" may be substituted by "wafer" and vice versa.

Wafer Loading Step

With the susceptor 217 lowered to a predetermined transfer position, the gate valve 244 is opened, and the wafer 200 to be processed is transferred (loaded) into the process vessel 203 by a transfer robot (not shown). The wafer 200 loaded into the process vessel 203 is placed and supported on the three support pins 266 protruding from the substrate placing surface of the susceptor 217 in a horizontal orientation. After the wafer 200 is loaded into the process vessel 203 completely, an arm of the transfer robot is retracted from the process vessel 203, and the gate valve 244 is closed. Thereafter, the susceptor 217 is elevated to a predetermined process position such that the wafer 200 to be processed is transferred from the three support pins 266 onto the susceptor 217.

According to the present embodiments, a structure (also referred to as a "high aspect ratio structure") whose aspect ratio is 20 or more is formed on the surface of the wafer 200 to be processed. The silicon film serving as the silicon-containing film to be modified is formed in advance on the surface of the wafer 200 including an inner surface of the high aspect ratio structure. In the present embodiments, for example, the high aspect ratio structure may include a groove structure such as a trench and a cylindrical structure such as a pillar hole. In the following, the surface of the wafer 200 may include a surface of the high aspect ratio structure formed on the wafer 200 such as an inner surface and a bottom surface of the high aspect ratio structure.

Pressure and Temperature Adjusting Step

Subsequently, an inner atmosphere of the process vessel 203 is vacuum-exhausted by the vacuum pump 246 such that an inner pressure of the process vessel 203 reaches and is maintained at a desired process pressure. The inner pressure of the process vessel 203 is measured by a pressure sensor (not shown), and the APC valve 242 is feedback-controlled based on the measured pressure information. In addition, the wafer 200 is heated by the heater 217b such that a temperature of the wafer 200 reaches and is maintained at a desired process temperature. When the inner pressure of the process vessel 203 reaches and is stabilized at the desired process pressure and the temperature of the wafer 200 reaches and is stabilized at the desired process temperature, a doping process described later is performed.

Doping Process (Doping Step)

In the doping process, the $B_2H_6$ gas serving as the boron-containing gas and the $H_2$ gas serving as the hydrogen-containing gas are supplied into the process vessel 203 to plasma-excite the $B_2H_6$ gas and the $H_2$ gas. Thereby, the active species containing boron and the active species containing hydrogen are generated. Specifically, the valves 253a and 253b are opened to mix and to supply the boron-containing gas and the hydrogen-containing gas into the process chamber 201 via the gas inlet port 234, the buffer chamber 237 and the gas outlet port 239 while flow rates of the boron-containing gas and the hydrogen-containing gas are adjusted by the MFCs 252a and 252b, respectively. When supplying a mixed gas of the boron-containing gas and the hydrogen-containing gas, the high frequency power is applied to the resonance coil 212 from the high frequency power supply 273. As a result, the donut-shaped induction plasma when viewed from above is excited at the height corresponding to the electric midpoint of the resonance coil 212 in the plasma generation space 201a.

The boron-containing gas in the mixed gas is activated (excited) by plasma-exciting the induction plasma and dissociates. Thereby, the active species containing boron is generated in the process vessel 203. The active species containing boron may include at least one among an excited boron atom (B*), an ionized boron atom and a boron radical. Similarly, the hydrogen-containing gas in the mixed gas is activated by plasma-exciting the induction plasma and dissociates. Thereby, the active species containing hydrogen is generated in the process vessel 203. The active species containing hydrogen may include at least one among an excited hydrogen atom (H*), an ionized hydrogen atom and a hydrogen radical.

Then, the active species containing boron generated as described above is supplied to the wafer 200 together with the active species containing hydrogen. As a result, the silicon film formed on the surface of the wafer 200 is modified. Thereby, the boron-containing layer is formed on the surface of the wafer 200 by injecting boron serving as the impurity into the silicon film to be modified.

That is, by plasma-exciting the boron-containing gas serving as the impurity-containing gas and the hydrogen-containing gas supplied into the process chamber 201 and by supplying the active species containing boron serving as the impurity generated by plasma-exciting the boron-containing gas to the surface of the wafer 200, the boron-containing layer serving as an impurity-containing layer is formed on the surface of the wafer 200.

For example, process conditions of the doping step are as follows:

A supply flow rate of the $B_2H_6$ gas: from 1 sccm 100 sccm, preferably from 2 sccm to 10 sccm;

A supply flow rate of the $H_2$ gas: from 100 sccm to 3,000 sccm, preferably from 1,000 sccm to 2,000 sccm;

A supply time (time duration) of supplying the $B_2H_6$ gas and the $H_2$ gas: from 1 seconds to 300 seconds, preferably from 10 seconds to 60 seconds;

The high frequency power: from 100 W to 5,000 W, preferably from 500 W to 3,500 W; A process temperature: from the room temperature to 900° C., preferably from 500° C. to 700° C.;

A process pressure: from 5 Pa to 150 Pa, preferably from 30 Pa to 150 Pa; and

A distance from the plasma generation space 201a to the surface of the wafer 200: from 10 mm to 150 mm, preferably from 30 mm to 100 mm.

In the present embodiments, the $B_2H_6$ gas diluted to 2% with the $H_2$ gas is supplied as the boron-containing gas supplied through the boron-containing gas supplier. That is, the supply flow rate of the $B_2H_6$ gas of the process conditions described above indicates the supply flow rate of the boron-containing gas diluted to 2% with the $H_2$ gas.

In particular, by setting the process pressure to 30 Pa or more, it is possible to suppress an occurrence of the sputtering on an inner wall of the process vessel 203 under the present process conditions. The distance from the plasma generation space 201a to the surface of the wafer 200 described above refers to a distance from a lower end position of the resonance coil 212 to the surface of the wafer 200. In the present specification, a notation of a numerical range such as "from 1 sccm 100 sccm" means a range equal to or higher than 1 sccm and equal to or less than 100 sccm. The same also applies to other numerical ranges described herein.

In the doping process, a partial pressure of the boron-containing gas with respect to a total pressure of the mixed gas (that is, the boron-containing gas and the hydrogen-containing gas) in the process chamber 201 is set (or adjusted) to a predetermined partial pressure less than a partial pressure at which the boron-containing gas may form deposits containing a polymer (multimer) in the process chamber 201. That is, the predetermined partial pressure is set to be within a range in which the deposits containing boron serving as the impurity does not occur). For example, the partial pressure of the boron-containing gas may be adjusted to the predetermined partial pressure equal to or less than 0.01 Pa, preferably equal to or less than 0.002 Pa. Specifically, by individually controlling the MFC 252a in the boron-containing gas supplier (impurity-containing gas supplier) and the MFC 252b in the hydrogen-containing gas supplier (dilution gas supplier), it is possible to adjust the partial pressure of the boron-containing gas with respect to the total pressure of the mixed gas in the process chamber 201 to the predetermined partial pressure. By setting the partial pressure of the boron-containing gas to the total pressure of the mixed gas in the process chamber 201 to 0.01 Pa or less in the doping process as described above, it is possible to suppress the generation of the deposits containing boron, and by setting the partial pressure of the boron-containing gas to the total pressure of the mixed gas in the process chamber 201 to 0.002 Pa or less in the doping process as described above, it is possible to further suppress the generation of the deposits containing boron. When the partial pressure of the boron-containing gas is greater than 0.01 Pa, a surface roughness may be significantly increased by the deposits containing boron attached to the surface of the wafer 200. As a result, the device characteristics may deteriorate. In addition, the deposits containing boron attached to the surface of the wafer 200 may adversely affect other process of the substrate processing performed after the doping process (for example, a film-forming process). Such adverse effects include, for example, deterioration in a uniformity of substrate processing.

The partial pressure of the boron-containing gas may also be adjusted by controlling the exhauster and adjusting the total pressure of the mixed gas in the process chamber 201. However, when the total pressure of the mixed gas in the process chamber 201 is reduced (for example, less than 30 Pa) in order to reduce the partial pressure of the boron-containing gas, the sputtering on the inner wall of the process vessel 203 is likely to occur. Therefore, it is preferable to adjust the partial pressure of the boron-containing gas by controlling a supply flow rate ratio with the hydrogen-containing gas serving as the dilution gas.

The deposits containing boron serving as the impurity may contain at least a polymer (multimer) of the boron-containing gas serving as the impurity-containing gas. In particular, the $B_2H_6$ gas serving as the boron-containing gas tends to form a polymer (multimer) such as decaborane $(B_{10}H_{14})$. As the partial pressure (concentration) of the boron-containing gas becomes higher, the polymer is likely to be generated. When the polymer is generated, the polymer is deposited on a surface of a film such as the silicon film to form the deposits. In addition to the polymer, boron serving as the impurity may remain on the surface of the film without being doped in the film to thereby form the deposits. By setting the partial pressure of the boron-containing gas to the total pressure of the impurity-containing gas to 0.01 Pa or less in the doping process as described above, the polymer containing boron is less likely to be generated, and by setting the partial pressure of the boron-containing gas to the total pressure of the impurity-containing gas to 0.002 Pa or less in the doping process as described above, the polymer containing boron is less likely to be generated as compared with a case when the partial pressure is 0.01 Pa or less and greater than 0.002 Pa. Therefore, it is possible to suppress the generation of the deposits containing boron. However, when the partial pressure of the boron-containing gas is less than 0.0001 Pa, boron is hardly doped into the surface of the film. By setting the partial pressure of the boron-containing gas to 0.0001 Pa or more, it is possible to perform the doping process of doping boron into the surface of the film at a practical speed.

After a predetermined time has elapsed and a predetermined amount of boron is injected into the wafer 200 completely, the supply of the power from the high frequency power supply 273 is stopped and the valves 253a and 253b are closed to stop the supply of the boron-containing gas and the supply of the hydrogen-containing gas into the process chamber 201.

The active species containing boron generated by plasma-exciting the boron-containing gas is isotropic. Therefore, the active species containing boron is uniformly supplied to the surface of the wafer 200. Thereby, the boron-containing layer serving as the impurity-containing layer is conformally formed with respect to the wafer 200, in particular, with respect to the inner surface of the high aspect ratio structure whose aspect ratio is 20 or more. A step coverage of the boron-containing layer formed in the doping process is equal to or greater than 70%, preferably equal to or greater than 80%.

According to the present embodiments, in the doping process, by adjusting at least one among: (i) a magnitude of the high frequency power for plasma-exciting the impurity-containing gas (boron-containing gas) and the dilution gas (hydrogen-containing gas); (ii) the supply time of the impurity-containing gas and the dilution gas; and (iii) the partial pressure of the impurity-containing gas, it is possible to control (or adjust) the step coverage of the boron-containing layer formed on the surface of the wafer 200 to be equal to or higher than a predetermined value.

Specifically, in the doping process, by reducing the magnitude of the high frequency power for plasma-exciting the boron-containing gas and the hydrogen-containing gas, it is possible to adjust the step coverage of the boron-containing layer to be increased, and by setting the magnitude of the high frequency power to a predetermined power level or less, it is possible to adjust the step coverage of the boron-containing layer to a predetermined level or more.

In addition, in the doping process, by lengthening the supply time of the boron-containing gas and the hydrogen-containing gas, it is possible to adjust the step coverage of the boron-containing layer to be increased, and by setting the supply time of the boron-containing gas and the hydrogen-containing gas to a predetermined amount of time or more, it is possible to adjust the step coverage of the boron-containing layer to a predetermined value or more.

Oxidation Process (Oxidation Step)

Subsequently, the $O_2$ gas serving as the oxygen-containing gas is supplied into the process vessel 203 to plasma-excite the $O_2$ gas. Thereby, the active species containing oxygen is generated. Specifically, the valve 253c is opened to supply the $O_2$ gas into the process chamber 201 via the gas inlet port 234, the buffer chamber 237 and the gas outlet port 239 while a flow rate of the $O_2$ gas is adjusted by the MFC 252c. When supplying the $O_2$ gas, the high frequency power is applied to the resonance coil 212 from the high frequency power supply 273. As a result, the donut-shaped induction plasma when viewed from above is excited at the height corresponding to the electric midpoint of the resonance coil 212 in the plasma generation space 201a.

The $O_2$ gas in the mixed gas is activated (excited) by plasma-exciting the induction plasma and dissociates. Thereby, the active species containing oxygen is generated in the process vessel 203. The active species containing oxygen may include at least one among an excited oxygen atom (O*), an ionized oxygen atom and an oxygen radical.

Then, the active species containing oxygen generated as described above is supplied to the wafer 200. As a result, the oxide layer is formed by oxidizing the surface of the boron-containing layer formed on the surface of the wafer 200 by the doping process described above.

That is, by plasma-exciting the $O_2$ gas serving as the oxygen-containing gas supplied into the process chamber 201 after the boron-containing layer serving as the impurity-containing layer is formed on the surface of the wafer 200 and by supplying the active species containing oxygen generated by plasma-exciting the oxygen-containing gas to the surface of the wafer 200, the oxide layer serving as the cap layer is formed on the surface of the boron-containing layer serving as the impurity-containing layer. Thereby, it is possible to suppress the desorption of boron serving as the impurity from the boron-containing layer serving as the impurity-containing layer. As a result, it is possible to maintain a high level of the concentration of boron (here-inafter, also referred to as a "boron concentration") in the boron-containing layer.

For example, process conditions of the oxidation step are as follows:

A supply flow rate of the $O_2$ gas: from 100 sccm to 2,000 sccm;

A supply time (time duration) of the $O_2$ gas: from 10 seconds to 60 seconds, preferably from 10 seconds to 30 seconds;

The high frequency power: from 100 W to 5,000 W, preferably from 500 W to 3,500 W;

A process temperature: from the room temperature to 900° C., preferably from 500° C. to 700° C.;

A process pressure: from 5 Pa to 100 Pa, more preferably from 30 Pa to 100 Pa; and A distance from the plasma generation space 201a to the surface of the wafer 200: from 10 mm to 150 mm, preferably from 30 mm to 100 mm.

By performing the oxidation process, the oxide layer is conformally formed with respect to the wafer 200, in particular, with respect to the inner surface of the high aspect ratio structure whose aspect ratio is 20 or more. A step coverage of the oxide layer formed in the oxidation process is equal to or greater than 70%, preferably equal to or greater than 80%. In particular, according the present embodiments, it is possible to suppress the attachment of the deposits containing boron to the inner surface of the high aspect ratio structure in the doping process. Therefore, it is possible to prevent the step coverage of the oxide layer (or the uniformity) from deteriorating due to the deposits containing boron attached to the surface of the wafer 200.

According to the oxidation process, by supplying the active species containing oxygen to the surface of the wafer 200, it is possible to further remove the deposits attached to the surface of the wafer 200. That is, even when a small amount of the deposits are attached to the surface of the wafer 200, it is possible to further remove the deposits by performing this oxidation process. However, when the deposits are removed by the oxidation process, the oxidation process is performed until the deposits are completely removed. Therefore, the process time of performing the oxidation process may be lengthened as compared with a case where no deposits are attached. As a result, the oxide layer formed by the oxidation process may become thicker than a desired thickness. In addition, a part of boron serving as the impurity may be desorbed from the boron-containing layer by the oxidation process. As a result, the boron concentration may decrease. Therefore, even when the oxidation process is performed, it is preferable to perform the doping process so as to suppress the attachment of the deposits to the surface of the wafer 200 as in the present embodiments.

After-Purge Step and Returning to Atmospheric Pressure Step

After the oxidation process described above is completed, the supply of the $O_2$ gas into the process vessel 203 is stopped. The supply of the high frequency power to the resonance coil 212 is also stopped. In addition, the $N_2$ gas serving as the purge gas is supplied into the process vessel 203, and is exhausted through the exhaust pipe 231. Thereby, the inner atmosphere of the process vessel 203 is purged to remove a residual gas in the process vessel 203 and reaction by-products from the process vessel 203. Thereafter, the inner atmosphere of the process vessel 203 is replaced with the $N_2$ gas, and the inner pressure of the process vessel 203 is returned to the normal pressure (atmospheric pressure).

Wafer Unloading Step

Subsequently, the susceptor 217 is lowered to the predetermined transfer position until the wafer 200 is transferred to the support pins 266 from the susceptor 217. Thereafter, the gate valve 244 is opened, and the wafer 200 is unloaded out of the process vessel 203 by using the transfer robot (not shown). Thereby, the substrate processing according to the present embodiments is completed.

(3) Effects According to Present Embodiments

According to the present embodiments described above, it is possible to provide one or more of the following effects.

(a) By performing the doping process described above, it is possible to suppress the generation of the deposits containing the impurity such as boron and the attachment of the deposits on the wafer. Therefore, it is possible to omit a step of removing the deposits or to shorten a process time for removing the deposits. As a result, it is possible to improve the throughput. Further, even when an $O_2$ plasma process (that is, the oxidation process) is performed after the doping process, it is possible to omit the step of removing the deposits or to shorten the process time for removing the deposits. As a result, it is possible to shorten the process time of the $O_2$ plasma process, and it is also possible to suppress an increase in the thickness of the oxide layer. In addition, it is also possible to maintain a high level of impurity concentration in the impurity-containing layer.

(b) By suppressing the attachment of the deposits in the process vessel 203, it is possible to reduce a maintenance frequency of the process vessel 203 or a component in the process vessel 203.

(c) By adjusting, in the doping process described above, at least one among the magnitude of the high frequency power, the supply time of the impurity-containing gas and the partial pressure of the impurity-containing gas, it is possible to control the step coverage of the impurity-containing layer on the high aspect ratio structure to be equal to or higher than a predetermined value.

(d) By performing the oxidation process after the doping process described above, it is possible to improve the step coverage of the cap layer (oxide layer) formed on the impurity-containing layer. That is, by suppressing the formation of the deposits in the doping process, it is possible to suppress a decrease in the step coverage and an increase in the cap layer due to the deposits in the oxidation process after the doping process. Further, by suppressing the increase in the cap layer, as a result, it is possible to maintain a high level of the impurity concentration in the impurity-containing layer.

(e) By performing the oxidation process after the doping process described above, it is possible to remove a small amount of the deposits deposited in the doping process even when the small amount of the deposits are attached to the surface of the wafer 200.

(f) The same effects described above may be obtained similarly when a gas capable of forming deposits containing a polymer in the process chamber is used as the impurity-containing gas instead of the boron-containing gas or when a gas other than the $O_2$ gas is used as the oxygen-containing gas.

OTHER EMBODIMENTS

While the technique of the present disclosure is described in detail by way of the embodiments described above, the technique of the present disclosure is not limited thereto. The technique of the present disclosure may be modified in various ways without departing from the scope thereof.

While the embodiments described above are described by way of an example in which the $B_2H_6$ gas is used as the boron-containing gas in the doping process, the technique of the present disclosure is not limited thereto. For example, instead of the $B_2H_6$ gas, a gas including at least one among boron trichloride ($BCl_3$) gas and boron trifluoride ($BF_3$) gas may be used as the impurity-containing gas. Even in such a case, it is possible to similarly obtain the same effects of the sequence of the substrate processing according to the embodiments described above.

While the embodiments described above are described by way of an example in which boron is doped as the impurity, the technique of the present disclosure is not limited thereto. For example, instead of boron, at least one among arsenic (As), phosphorus (P) and gallium (Ga) may be used as the impurity. Even in such a case, it is possible to similarly obtain the same effects of the sequence of the substrate processing according to the embodiments described above.

While the embodiments described above are described by way of an example in which the hydrogen-containing gas is used as the dilution gas, the technique of the present disclosure is not limited thereto. For example, instead of the hydrogen-containing gas, a rare gas such as helium (He) gas, argon (Ar) gas, neon (Ne) gas, krypton (Kr) gas and xenon (Xe) gas may be used as the dilution gas. Even in such a case, it is possible to similarly obtain the same effects of the sequence of the substrate processing according to the embodiments described above.

While the embodiments described above are described by way of an example in which the $O_2$ gas is used as the oxygen-containing gas in the oxidation process, the technique of the present disclosure is not limited thereto. For example, instead of the $O_2$ gas, a gas such as ozone ($O_3$) gas, water vapor ($H_2O$ gas) and nitric oxide (NO) gas may be used as the oxygen-containing gas. Even in such a case, it is possible to similarly obtain the same effects of the sequence of the substrate processing according to the embodiments described above.

While the embodiments described above are described by way of an example in which the wafer provided with the silicon film serving as a modification target on the surface thereof is used, the technique of the present disclosure is not limited thereto. For example, instead of the silicon film, other silicon-containing film such as silicon oxide (SiO) film, silicon nitride (SiN) film and silicon oxynitride (SiON) film, a silicon-containing base of a silicon substrate, or a film containing an element other than silicon (for example, a film containing a metal element) may be used as the modification target. For example, an amorphous silicon film, a single crystal silicon film or a polycrystalline silicon film may be used as the silicon film serving as the modification target. For example, a stacked structure of a plurality of films (layers) such as the silicon film and the silicon oxide film formed on an upper surface of the silicon film may be used as the modification target. Even in such a case, it is possible to similarly obtain the same effects of the sequence of the substrate processing according to the embodiments described above.

Examples of Present Embodiments

Samples (that is, a sample #1 through a sample #7) which are wafers with a silicon film on surfaces thereof are prepared. The doping process is performed to the sample #1 through the sample #7 under the conditions shown in FIG. 4. Then, a water repellency of a surface of each sample (wafer) after the doping process and a distribution of a dose amount of boron in a depth direction of each sample after the doping process are evaluated. A silicon oxide layer serving as a natural oxide film is formed on the surface of each sample.

With respect to the sample #1, the doping process described above is performed by setting the process temperature to 700° C., the high frequency power to 3,500 W, the process pressure (total pressure) to 100 Pa, the partial pressure of the $B_2H_6$ gas serving as the boron-containing gas to 0.002 Pa, and the supply time of $B_2H_6$ gas and $H_2$ gas to 30 seconds. In addition, by setting the supply flow rate of the $B_2H_6$ gas (2% $B_2H_6$ gas) diluted to 2% with the $H_2$ gas to 2 sccm and the supply flow rate of the $H_2$ gas to 1,998 sccm so as to set the flow rate ratio of the $B_2H_6$ gas to the $H_2$ gas supplied into the process chamber to 1:50,000, the partial pressure of the boron-containing gas is set to 0.002 Pa.

With respect to the sample #2, the doping process described above is performed by setting the high frequency power to 2,000 W. The other process conditions of the sample #2 are the same as the process conditions of the sample #1.

With respect to the sample #3, the doping process described above is performed by setting the high frequency power to 500 W. The other process conditions of the sample #3 are the same as the process conditions of the sample #1.

With respect to the sample #4, the doping process described above is performed by setting the supply time of $B_2H_6$ gas and $H_2$ gas to 60 seconds. The other process conditions of the sample #4 are the same as the process conditions of the sample #1.

With respect to the sample #5, the doping process described above is performed by setting the partial pressure of the boron-containing gas to 0.01 Pa. That is, by setting the supply flow rate of the 2% $B_2H_6$ gas to 10 sccm and the supply flow rate of the $H_2$ gas to 1,990 sccm, the flow rate ratio of the $B_2H_6$ gas to the $H_2$ gas supplied into the process chamber is set to 1:10,000. Thereby, the partial pressure of the boron-containing gas is set to 0.01 Pa. The other process conditions of the sample #5 are the same as the process conditions of the sample #1.

With respect to the sample #6, the doping process described above is performed by setting the partial pressure of the boron-containing gas to 0.05 Pa. That is, by setting the supply flow rate of the 2% $B_2H_6$ gas to 50 sccm and the supply flow rate of the $H_2$ gas to 1,950 sccm, the flow rate ratio of the $B_2H_6$ gas to the $H_2$ gas supplied into the process chamber is set to 1:2,000. Thereby, the partial pressure of the boron-containing gas is set to 0.05 Pa. The other process conditions of the sample #6 are the same as the process conditions of the sample #1.

With respect to the sample #7, the doping process described above is performed by setting the partial pressure of the boron-containing gas to 0.1 Pa. That is, by setting the supply flow rate of the 2% $B_2H_6$ gas to 100 sccm and the supply flow rate of the $H_2$ gas to 1,900 sccm, the flow rate ratio of the $B_2H_6$ gas to the $H_2$ gas supplied into the process chamber is set to 1:1,000. Thereby, the partial pressure of the boron-containing gas is set to 0.1 Pa. The other process conditions of the sample #7 are the same as the process conditions of the sample #1.

Figure 5A:
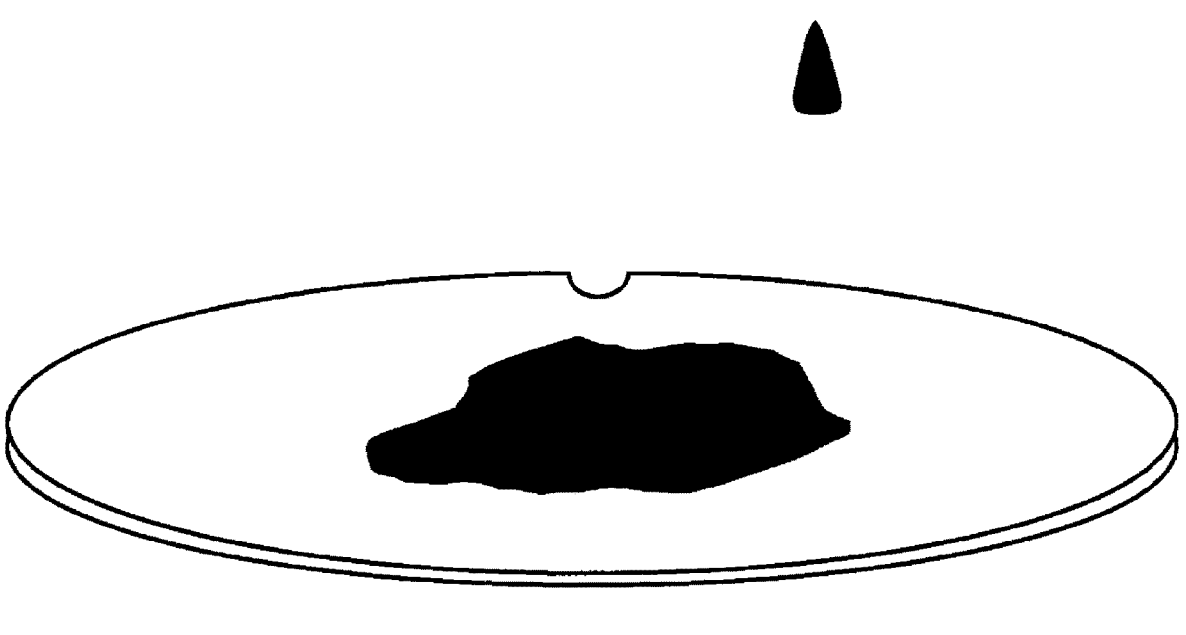
FIG. 5A is a diagram schematically illustrating a surface of a substrate when deposits are present on the surface of the substrate.
Figure 5B:
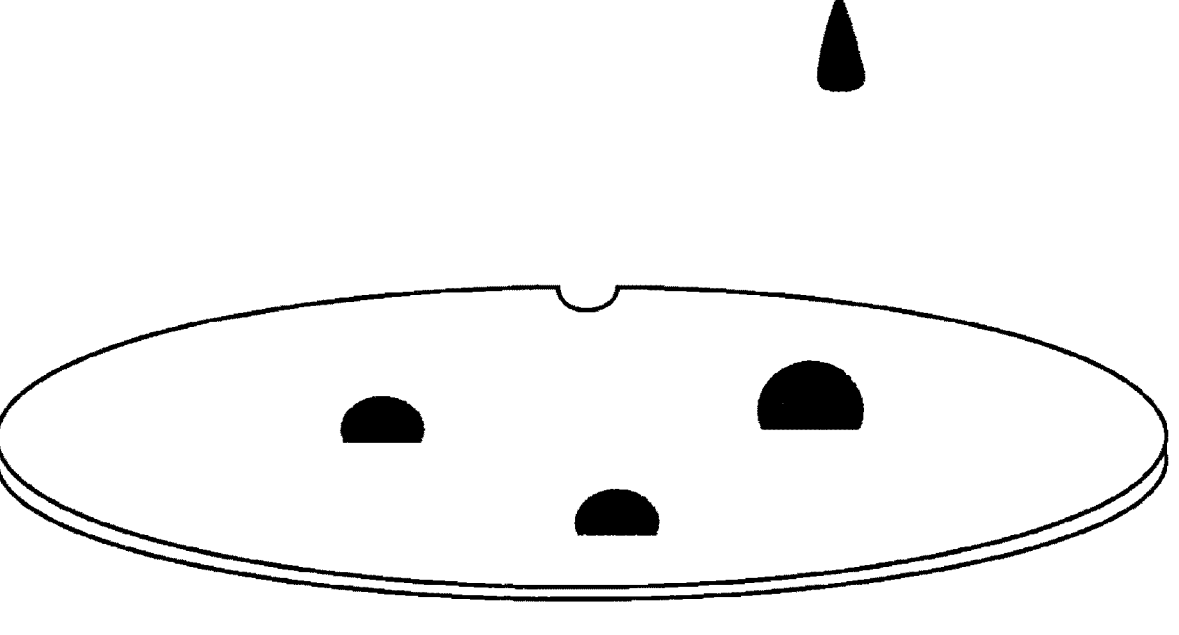
FIG. 5B is a diagram schematically illustrating the surface of the substrate when no deposits are present on the surface of the substrate.

Then, the sample #1 through the sample #7 after performing the doping process are washed using a 1% aqueous solution of hydrogen fluoride (HF) for 30 seconds. Then, states of the surfaces of the sample #1 through the sample #7 are compared. When the state of the surface indicates hydrophilicity as shown in FIG. 5A, the water repellency is set to "NO" in FIG. 4, and when the state of the surface indicates the water repellency as shown in FIG. 5B, the water repellency is set to "YES" in FIG. 4. When no deposits are present on the surface, the water repellency is exhibited even after the natural oxide film is removed by the HF, and when the deposits are present on the surface, the hydrophilicity is exhibited without exhibiting the water repellency even after the natural oxide film is removed by the HF.

As shown in FIG. 4, with respect to the sample #1 through the sample #4 in which the partial pressure of the boron-containing gas is set to 0.002 Pa and the sample #5 in which the partial pressure of the boron-containing gas is set to 0.01 Pa, the water repellency appears. Thus, it is confirmed that the attachment of the deposits to the surface of each of the sample #1 through the sample #5 is sufficiently suppressed. With respect to the sample #6 in which the partial pressure of the boron-containing gas is set to 0.05 Pa and the sample #7 in which the partial pressure of the boron-containing gas is set to 0.1 Pa, the water repellency does not appear. Thus, it is confirmed that the deposits are present on the surface of each of the sample #6 and the sample #7.

That is, it is confirmed that it is possible to suppress the generation of the deposits and to suppress the attachment of the deposits to the wafer by setting the partial pressure of the boron-containing gas in the doping process to 0.01 Pa or less, preferably 0.002 Pa or less.

Subsequently, using the secondary ion mass spectrometry (SIMS), a distribution of the concentration (in unit of atoms/cm$^3$) of boron contained in the boron-containing layer formed on each of the sample #1 through the sample #7 in the depth direction is analyzed.

Figures 6A, 6B, 6C:
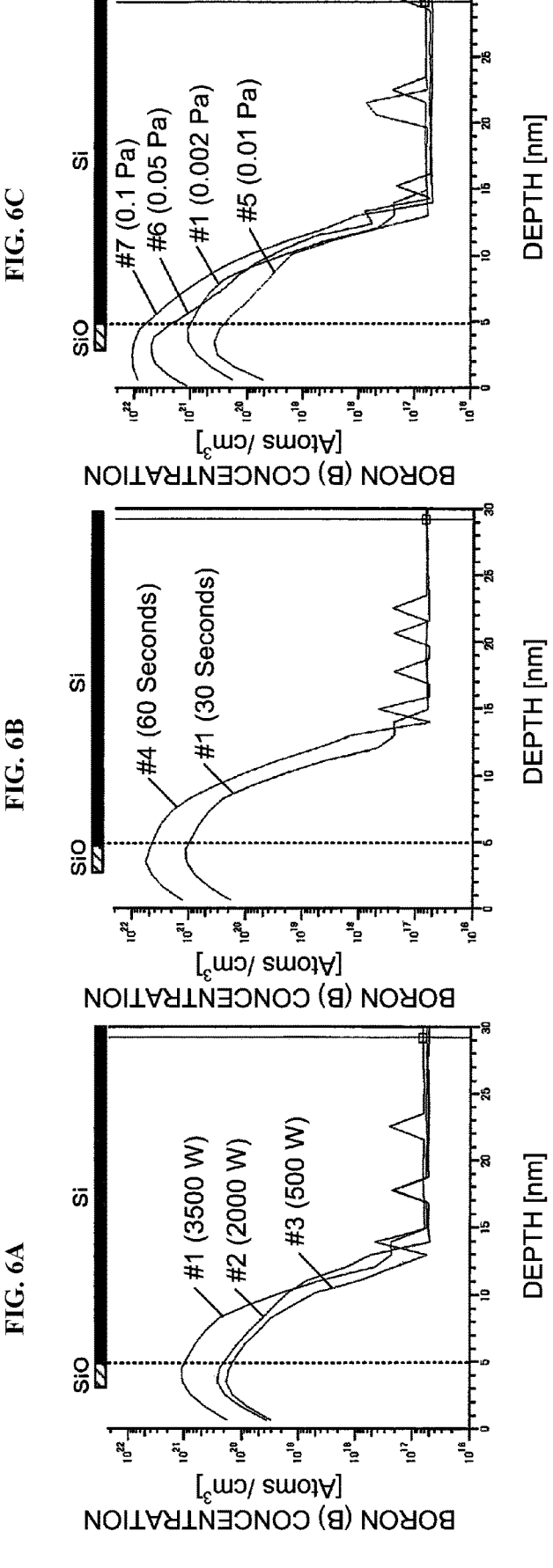
FIG. 6A is a diagram schematically illustrating a boron (B) concentration in each boron-containing layer formed by supplying a high frequency power of 3,500 W, 2,000 W and 500 W to the substrate.
FIG. 6B is a diagram schematically illustrating the boron concentration in each boron-containing layer formed by setting a supply time of a boron-containing gas to the substrate to 30 seconds and 60 seconds.
FIG. 6C is a diagram schematically illustrating the boron concentration in each boron-containing layer formed by setting a partial pressure of the boron-containing gas with respect to the substrate to 0.002 Pa, 0.01 Pa, 0.05 Pa and 0.1 Pa.

FIG. 6A schematically illustrates the SIMS analysis results of boron contained in the boron-containing layer formed on each of the sample #1 through the sample #3 in the depth direction from the surface of each of the sample #1 through the sample #3.

As shown in FIG. 6A, at a depth of 5 nm, a dose amount of the boron-containing layer of the sample #1 formed by supplying the high frequency power of 3,500 W thereto is increased as compared with the dose amount of the boron-containing layer of the sample #2 formed by supplying the high frequency power of 2,000 W thereto, and the dose amount of the boron-containing layer of the sample #2 formed by supplying the high frequency power of 2,000 W thereto is increased as compared with the dose amount of the boron-containing layer of the sample #3 formed by supplying the high frequency power of 500 W thereto. That is, it is confirmed that the dose amount depends on the magnitude of the high frequency power, and that the dose amount is controlled by the magnitude of the high frequency power.

FIG. 6B schematically illustrates the SIMS analysis results of boron contained in the boron-containing layer formed on each of the sample #1 and the sample #4 in the depth direction from the surface of each of the sample #1 and the sample #4.

As shown in FIG. 6B, at the depth of 5 nm, a dose amount of the boron-containing layer of the sample #4 formed by supplying the mixed gas of the boron-containing gas and the hydrogen-containing gas thereto for 60 seconds is increased as compared with the dose amount of the boron-containing layer of the sample #1 formed by supplying the mixed gas of the boron-containing gas and the hydrogen-containing gas thereto for 30 seconds. That is, it is confirmed that the dose amount depends on the supply time of the mixed gas of the boron-containing gas and the hydrogen-containing gas, and that the dose amount is controlled by the supply time of the mixed gas of the boron-containing gas and the hydrogen-containing gas.

FIG. 6C schematically illustrates the SIMS analysis results of boron contained in the boron-containing layer formed on each of the sample #1, the sample #5 through the sample #7 in the depth direction from the surface of each of the sample #1, the sample #5 through the sample #7.

As shown in FIG. 6C, at the depth of 5 nm, the dose amount of the boron-containing layer of the sample #1 formed by setting the partial pressure of the boron-containing gas supplied thereto to 0.002 Pa is increased as compared with a dose amount of the boron-containing layer of the sample #5 formed by setting the partial pressure of the boron-containing gas supplied thereto to 0.01 Pa. A dose amount of the boron-containing layer of the sample #6 formed by setting the partial pressure of the boron-containing gas supplied thereto to 0.05 Pa is increased as compared with the dose amount of the boron-containing layer of the sample #1 formed by setting the partial pressure of the boron-containing gas supplied thereto to 0.002 Pa, and a dose amount of the boron-containing layer of the sample #7 formed by setting the partial pressure of the boron-containing gas supplied thereto to 0.1 Pa is increased as compared with the dose amount of the boron-containing layer of the sample #6 formed by setting the partial pressure of the boron-containing gas supplied thereto to 0.05 Pa. That is, it is confirmed that the dose amount depends on the partial pressure of the boron-containing gas, and that the dose amount is controlled by the partial pressure of the boron-containing gas.

Subsequently, samples (that is, a sample #1' through a sample #7') (which are wafers provided with a groove-shaped structure of a depth of about 3.5 nm and with a silicon film on surfaces thereof) are prepared. The doping process is performed to the sample #1' through the sample #7' under the conditions shown in FIG. 4 in the same manner as the sample #1 through the sample #7 described above. Then, the step coverage (thickness uniformity of the layer) of the boron-containing layer on an inner surface of the groove-shaped structure is evaluated.

The step coverage is calculated as "100×Cbtm/Ctop" when the boron concentration (in unit of atoms/cm$^3$) near 0.25 nm and the boron concentration near 3.5 nm in the depth direction from the surface of each sample (wafer) are defined as "Ctop" and "Cbtm", respectively.

Figures 7A, 7B, 7C:
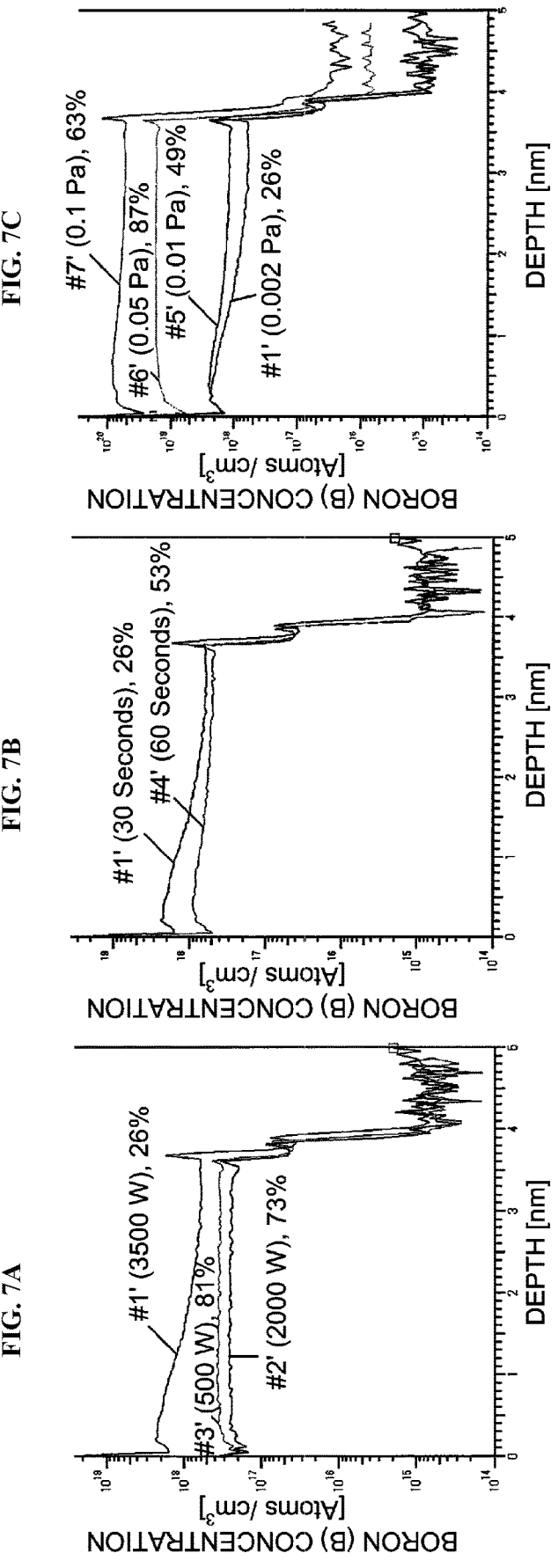
FIG. 7A is a diagram schematically illustrating the step coverage of each boron-containing layer formed by supplying the high frequency power of 3,500 W, 2,000 W and 500 W to the substrate.
FIG. 7B is a diagram schematically illustrating the step coverage of each boron-containing layer formed by setting the supply time of the boron-containing gas to the substrate to 30 seconds and 60 seconds.
FIG. 7C is a diagram schematically illustrating the step coverage of each boron-containing layer formed by setting the partial pressure of the boron-containing gas with respect to the substrate to 0.002 Pa, 0.01 Pa, 0.05 Pa and 0.1 Pa.

FIG. 7A schematically illustrates the SIMS analysis results of boron contained in the boron-containing layer formed on each of the sample #1' through the sample #3' in the depth direction from the surface of each of the sample #1' through the sample #3'.

A step coverage of the boron-containing layer of the sample #1' formed by supplying the high frequency power of 3,500 W thereto is 26%. A step coverage of the boron-containing layer of the sample #2' formed by supplying the high frequency power of 2,000 W thereto is 73%. A step coverage of the boron-containing layer of the sample #3' formed by supplying the high frequency power of 500 W thereto is 81%. That is, it is confirmed that the step coverage is improved by reducing the magnitude of the high frequency power in the doping process. That is, it is confirmed that the step coverage depends on the magnitude of the high frequency power, and that the step coverage is controlled by the magnitude of the high frequency power.

FIG. 7B schematically illustrates the SIMS analysis results of boron contained in the boron-containing layer formed on each of the sample #1' and the sample #4' in the depth direction from the surface of each of the sample #1' and the sample #4'.

A step coverage of the boron-containing layer of the sample #1' formed by supplying the mixed gas of the boron-containing gas and the hydrogen-containing gas thereto for 30 seconds is 26%. A step coverage of the boron-containing layer of the sample #4' formed by supplying the mixed gas of the boron-containing gas and the hydrogen-containing gas thereto for 60 seconds is 53%. That is, it is confirmed that the step coverage is improved by lengthening the supply time of the mixed gas of the boron-containing gas and the hydrogen-containing gas in the doping process. That is, it is confirmed that the step coverage depends on the supply time of the mixed gas of the boron-containing gas and the hydrogen-containing gas, and that the step coverage is controlled by the supply time of the mixed gas of the boron-containing gas and the hydrogen-containing gas.

FIG. 7C schematically illustrates the SIMS analysis results of boron contained in the boron-containing layer formed on each of the sample #1', the sample #5' through the sample #7' in the depth direction from the surface of each of the sample #1', the sample #5' through the sample #7'.

A step coverage of the boron-containing layer of the sample #1' formed by setting the partial pressure of the boron-containing gas supplied thereto to 0.002 Pa is 26%. A step coverage of the boron-containing layer of the sample #5' formed by setting the partial pressure of the boron-containing gas supplied thereto to 0.01 Pa is 49%. A step coverage of the boron-containing layer of the sample #6' formed by setting the partial pressure of the boron-containing gas supplied thereto to 0.05 Pa is 87%. A step coverage of the boron-containing layer of the sample #7' formed by setting the partial pressure of the boron-containing gas supplied thereto to 0.1 Pa is 63%. That is, it is confirmed that the step coverage depends on the partial pressure of the boron-containing gas, and that the step coverage is controlled by the partial pressure of the boron-containing gas.

That is, it is confirmed that both of the dose amount and the step coverage of the boron-containing layer with boron injected as the impurity depend on the magnitude of the high frequency power, the supply time of the mixed gas of the boron-containing gas and the hydrogen-containing gas and the partial pressure of the boron-containing gas in the doping process, and that both of the dose amount and the step coverage of the boron-containing layer with boron injected as the impurity are controlled by the magnitude of the high frequency power, the supply time of the mixed gas of the boron-containing gas and the hydrogen-containing gas and the partial pressure of the boron-containing gas in the doping process.

As described above, according to the present embodiments, it is possible to suppress the generation of the deposits when performing the doping process to the substrate using the plasma.

What is claimed is:

1. A method of processing a substrate, comprising:
(A) modifying a surface of the substrate into an impurity-containing layer by performing:
  (a) supplying an impurity-containing gas containing an impurity and a dilution gas into a process chamber in which the substrate is accommodated;

(b) plasma-exciting the impurity-containing gas and the dilution gas; and
  (c) supplying an active species containing an impurity generated by plasma-exciting the impurity-containing gas and the dilution gas to the substrate; and
(B) modifying a surface of the impurity-containing layer into an oxide layer after the impurity-containing layer is formed on the surface of the substrate, by performing:
  (d) plasma-exciting an oxygen-containing gas; and
  (e) supplying an active species containing oxygen generated by plasma-exciting the oxygen-containing gas to the surface of the substrate,
wherein a flow rate ratio of the impurity-containing gas to the dilution gas is controlled in (a) such that a partial pressure of the impurity-containing gas in the process chamber is set to a predetermined partial pressure less than a partial pressure at which the impurity-containing gas forms deposits containing a polymer in the process chamber.

2. The method of claim 1, wherein the predetermined partial pressure is equal to or less than 0.002 Pa.

3. The method of claim 1, wherein the dilution gas comprises at least one selected from the group of a hydrogen-containing gas and a rare gas.

4. The method of claim 1, wherein the impurity comprises at least one selected from the group of boron, arsenic, phosphorus and gallium.

5. The method of claim 1, wherein the impurity-containing gas comprises at least one selected from the group of diborane gas, boron trichloride gas and boron trifluoride gas.

6. The method of claim 1, wherein the surface of the substrate comprises at least one selected from the group of a silicon-containing film and a silicon-containing base of the substrate.

7. The method of claim 6, wherein the surface of the substrate comprises at least one selected from the group of a silicon oxide film, a silicon nitride film and a silicon oxynitride film.

8. The method of claim 1, wherein a step coverage of the impurity-containing layer formed on the surface of the substrate is controlled by adjusting a magnitude of a high frequency power supplied to plasma-excite the impurity-containing gas and the dilution gas in (b).

9. The method of claim 8, wherein the step coverage of the impurity-containing layer is adjusted to be increased by reducing the magnitude of the high frequency power in (b).

10. The method of claim 1, wherein a high aspect ratio structure whose aspect ratio is 20 or more is provided on the surface of the substrate, and the oxide layer is conformally formed with respect to an inner surface of the high aspect ratio structure.

11. The method of claim 10, wherein a step coverage of the oxide layer formed on the inner surface of the high aspect ratio structure is equal to or greater than 70%.

12. A method of manufacturing a semiconductor device, comprising the method of claim 1.

13. The method of claim 1, wherein the predetermined partial pressure is equal to or less than 0.01 Pa.

* * * * *